United States Patent [19]
Takahashi

[11] Patent Number: 6,135,858
[45] Date of Patent: Oct. 24, 2000

[54] SUBSTRATE HOLDING DEVICE AND POLISHING METHOD AND POLISHING APPARATUS USING THE SAME

[75] Inventor: Kazuo Takahashi, Kawasaki, Japan

[73] Assignee: Canon Kabushiki Kaisha, Tokyo, Japan

[21] Appl. No.: 09/108,372

[22] Filed: Jul. 1, 1998

[30] Foreign Application Priority Data

Jul. 3, 1997 [JP] Japan ................................. 9-193121

[51] Int. Cl.⁷ .................................................. B24B 7/22
[52] U.S. Cl. ............................ 451/41; 451/288; 451/398
[58] Field of Search .............................. 451/41, 55, 288, 451/287, 388, 398

[56] References Cited

U.S. PATENT DOCUMENTS

| | | | |
|---|---|---|---|
| 4,503,335 | 3/1985 | Takahashi | 250/548 |
| 4,869,481 | 9/1989 | Yabu et al. | 269/21 |
| 5,486,129 | 1/1996 | Sandhu et al. | 451/287 |
| 5,584,751 | 12/1996 | Kobayashi et al. | 451/41 |
| 5,605,488 | 2/1997 | Ohashi et al. | 451/53 |
| 5,720,845 | 2/1998 | Liu | 156/345 |
| 5,795,215 | 8/1998 | Guthrie et al. | 451/286 |

FOREIGN PATENT DOCUMENTS

| | | | |
|---|---|---|---|
| 2264864 | 11/1987 | Japan | 451/288 |
| 5-74749 | 3/1993 | Japan . | |
| 5-217819 | 8/1993 | Japan . | |

Primary Examiner—Robert A. Rose
Attorney, Agent, or Firm—Fitzpatrick, Cella, Harper & Scinto

[57] ABSTRACT

A substrate holding device includes a frame member for holding a substrate on an open side of the frame member, the open side being formed by a recess in the frame member, a plurality of fluid chambers disposed concentrically in the recess of the frame member, a respective wall face on the substrate holding side of the frame member at least partially defining each fluid chamber, each wall face being formed by a deformable resilient film, a controller for separately controlling the pressure inside of each of the fluid chambers, and at least one guide ring disposed adjacent to a respective one of the plurality of fluid chambers on the substrate holding side of the frame member, the at least one guide ring being movable relative to the frame member by varying the pressure inside a respective fluid chamber.

24 Claims, 7 Drawing Sheets

SUBSTRATE HOLDING DEVICE AND POLISHING METHOD AND POLISHING APPARATUS USING THE SAME

BACKGROUND OF THE INVENTION

1. Field of the Invention

The present invention relates to a substrate holding device for holding a substrate, such as a semiconductor wafer (made of Si, GaAs, InP, or the like), or a quartz substrate or a glass substrate having a plurality of island-like semiconductor areas formed thereon. The present invention also relates to a polishing method and a polishing apparatus employing the substrate holding device.

2. Description of the Related Art

The production of increasingly ultra-fine semiconductor devices and semiconductor devices having a larger number of layered wirings has resulted in an increasing demand for more precision in the flatness in a plane (i.e., planarization) of semiconductor wafers (made of Si, GaAs, InP, or the like) or quartz or glass semiconductors having a plurality of island-like semiconductor areas on their surfaces. In addition, with the advent of SOI (Silicon On Insulator) wafers and the necessity of three-dimensional integration, global planarization of the surface of a wafer is desired. Here, the substrate surface may be a semiconductor layer surface having a device formed thereon, the surface of an insulating layer formed on the aforementioned semiconductor layer, or the surface of an electrically-conductive layer formed on the aforementioned insulating film.

For example, a chemical mechanical polishing (CMP) apparatus, such as that described below, is known as an apparatus for performing micro-planarization, not to mention global planarization, on the aforementioned types of substrates.

Figure 7:
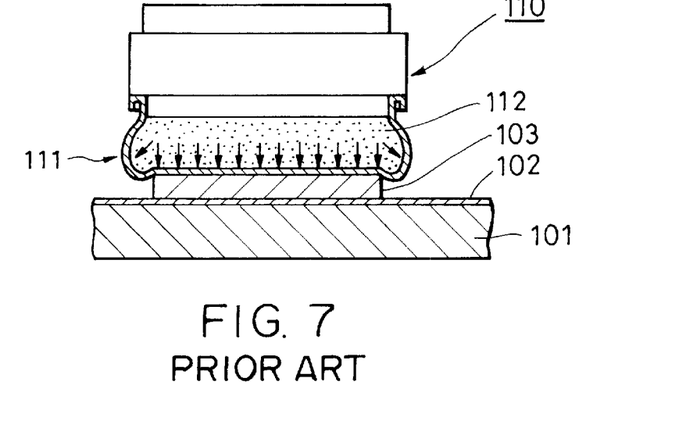
FIG. 7 is a view showing a conventional chemical mechanical polishing apparatus.

Conventional Polishing Method (A): As shown in FIG. 7, the chemical mechanical polishing apparatus (disclosed in Japanese Unexamined Patent Publication No. 5-74749) comprises a table 101 with a polishing cross 102 being affixed to a processing surface of the table 101; and a top ring 110 having a resilient member 111, and within which, a pressurization fluid 112 is enclosed. In this chemical mechanical polishing apparatus, a wafer 103, placed on the polishing cross 102, which is affixed to the table 101, is pressed by the resilient member 111 of the top ring 110 with a uniform pressing (processing) force. While a polishing liquid (not shown) is being supplied, the table 101, which does not rotate, undergoes a circular motion in order to polish the surface of a device on the wafer 103.

Figure 8A:
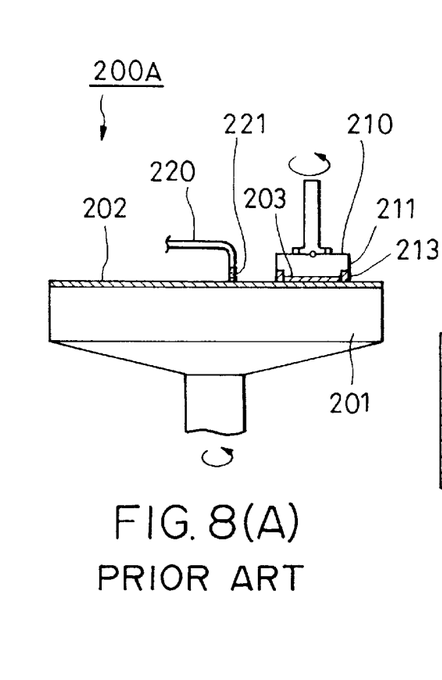
FIGS. 8(A) and 8(B) are views showing aspects of another conventional chemical mechanical polishing apparatus.
Figure 8B:
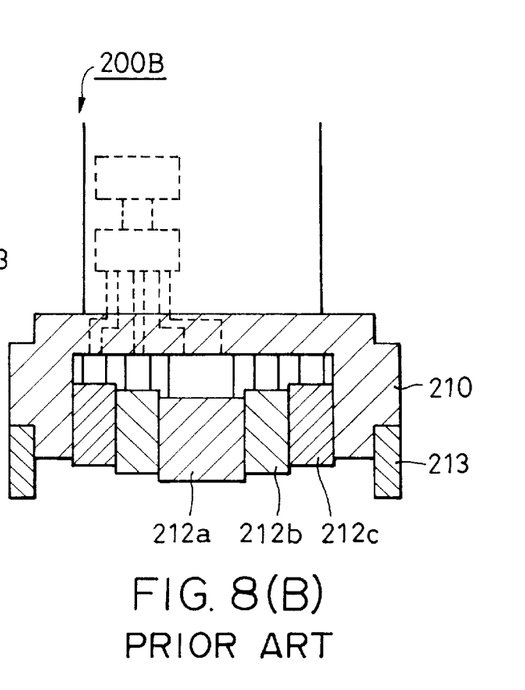

Conventional Polishing Method (B): The polishing apparatus shown in FIGS. 8(A) and 8(B) comprises a top ring 210 and a turntable 201, each of which rotates, wherein a semiconductor wafer 203 is placed between the turntable 201 and the top ring 210. While a polishing liquid 221 is being supplied from a nozzle 220, a predetermined processing pressure is exerted onto the surface of the semiconductor wafer 203 to polish it. In this polishing apparatus, the semiconductor wafer 203 is fitted to the inner diameter portion of a guide ring 213 projecting at the outer peripheral portion of the top ring 210. The amount of downward projection of a plurality of concentrically disposed projecting portions 212a, 212b, and 212c is varied in stages such that the amount of projection of the center projecting portion 212a is greatest. With the center projecting portion 212a projecting downward, the semiconductor wafer 203 is pressed and polished.

In both of the above-described conventional methods (A) and (B), however, the substrate frequently gets dislodged from the top ring during polishing.

In addition, in the conventional method (A), it is difficult to fit the substrate to the top ring and to remove it from the top ring. Further, in the conventional method (B), the surface of the substrate to be polished does not match the polishing (processing) surface of the turntable, that is, the surface of the polishing tool. In this case, for example, the thickness of the insulating layer will vary with the location on the integrated circuit (IC) chip.

SUMMARY OF THE INVENTION

Accordingly, a first object of the present invention is to provide a substrate holding device in which the substrate does not get displaced from the substrate holding device during polishing and in which the substrate can be easily fitted to and removed from the substrate holding device.

A second object of the present invention is to provide a substrate holding device, and a polishing method and apparatus employing the substrate holding device, wherein the substrate holding device automatically makes uniform the surface of a substrate in accordance with waviness or warping of the substrate, in order to planarize the surface of the substrate to be polished with high precision.

In a first aspect, the present invention provides a substrate holding device comprising a frame member for holding a substrate on an open side of the frame member, the open side being formed by a recess in the frame member, a plurality of fluid chambers disposed concentrically in the recess of the frame member, a respective wall face on the substrate holding side of the frame member at least partially defining each fluid chamber, each wall face being formed by a deformable resilient film and control means for separately controlling the pressure inside each of the fluid chambers.

The control means can effect at least one of increasing and decreasing the pressure inside each of the fluid chambers, selectively. The control means also can increase the inside pressure in one of the plurality of chambers to cause the resilient film of that fluid chamber to protrude outward, thereby removing a substrate being held.

The recess of the frame member can have an inner peripheral face, which is shaped to allow a substrate to be removably fitted thereto.

The substrate holding device can further comprise a guide ring having an inner peripheral face shaped to allow the substrate to be removably fitted thereto, the guide ring being disposed above the outer surface of the resilient film of the concentrically outermost fluid chamber.

The frame member can be an assembly of a plurality of elements.

The substrate holding device can further include a deformable backing member disposed along the outer surfaces of the resilient films, which are exposed on the substrate holding side of the frame member. In this instance, the backing member can be made of a material having a greater coefficient of friction than that of the resilient films.

In another aspect, the present invention provides a polishing method for polishing a surface of a substrate, the method including steps of providing a substrate holding device that includes (i) a frame member for holding a substrate on an open side of the frame member, the open side being formed by a recess in the frame member, (ii) a plurality of fluid chambers disposed concentrically in the recess, a respective wall face on the substrate holding side of the frame member at least partially defining each fluid chamber, each wall face being formed by a resilient film and (iii) control means for separately controlling the pressure inside of each of the fluid chambers, holding a substrate to be polished with the substrate holding device, and polishing a surface of the substrate by supplying an abrasive between the surface of the substrate, held by the substrate holding device, and a polishing surface of a polishing tool, which contracts the surface of the substrate as a result of a predetermined processing pressure being exerted by the polishing tool onto the surface of the substrate.

The polishing method can further include increasing the inside pressure of the fluid chamber, which is located at the center of the recess, to cause the resilient film of that chamber to bulge and push out the substrate, in order to remove a polished substrate.

The substrate can be one in which a functional element has been formed thereon or one in which a functional element has not yet been formed thereon. Also, the substrate can be a semiconductor substrate or an insulating substrate having a semiconductor film formed thereon. Further, the substrate can be at least one of an insulating film and a metallic film formed on a surface thereof.

In yet another aspect, the present invention provides a polishing apparatus for polishing a surface of a substrate. The apparatus includes a substrate holding device for holding a substrate, the substrate holding device comprising (i) a frame member for holding the substrate on an open side of the frame member, the open side being formed by a recess in the frame member, (ii) a plurality of fluid chambers disposed concentrically in the recess, a respective wall face on the substrate holding side of the frame member at least partially defining each fluid chamber, each wall face being formed by a deformable resilient film, and (iii) control means for separately controlling the pressure inside of each of the fluid chambers, and a polishing device for polishing a surface of the substrate being held by the substrate holding device, the polishing device comprising a polishing tool, wherein an abrasive is supplied between a surface of the substrate to be polished and the polishing surface of the polishing tool, and the substrate is polished by causing the polishing surface of the polishing tool to contact and exert a predetermined processing pressure on the surface of the substrate to be polished.

The control means can increase the inside pressure of the fluid chamber, which is located at the center of the recess, to cause the resilient film of that chamber to bulge and push out the substrate, in order to remove a polished substrate.

The recess of the frame member can have an inner peripheral face, which is shaped to allow a substrate to be removably fitted thereto.

In still another aspect, the present invention provides a bonding method for bonding substrates. The method includes providing a substrate holding device that comprises (i) a frame member for holding a substrate on an open side of the frame member, the open side being formed by a recess in the frame member, (ii) a plurality of fluid chambers disposed concentrically in the recess, a respective wall face on the substrate holding side of the frame member at least partially defining each fluid chamber, each wall face being formed by a deformable resilient film and (iii) control means for separately controlling the pressure inside of each of the fluid chambers, holding one of the substrates using the substrate holding device, and joining the substrate being held by the substrate holding device with another substrate.

The bonding method can further include increasing the inside pressure of the fluid chamber, which is located at the center of the recess, to cause the resilient film of that chamber to bulge and push out the substrates in order to remove the joined substrates.

BRIEF DESCRIPTION OF THE DRAWINGS

Like reference numerals correspond to like or corresponding elements throughout the views.

DESCRIPTION OF THE PREFERRED EMBODIMENTS

A description will now be given of embodiments of the substrate holding device in accordance with the present invention, with reference to the drawings.

Figure 1:
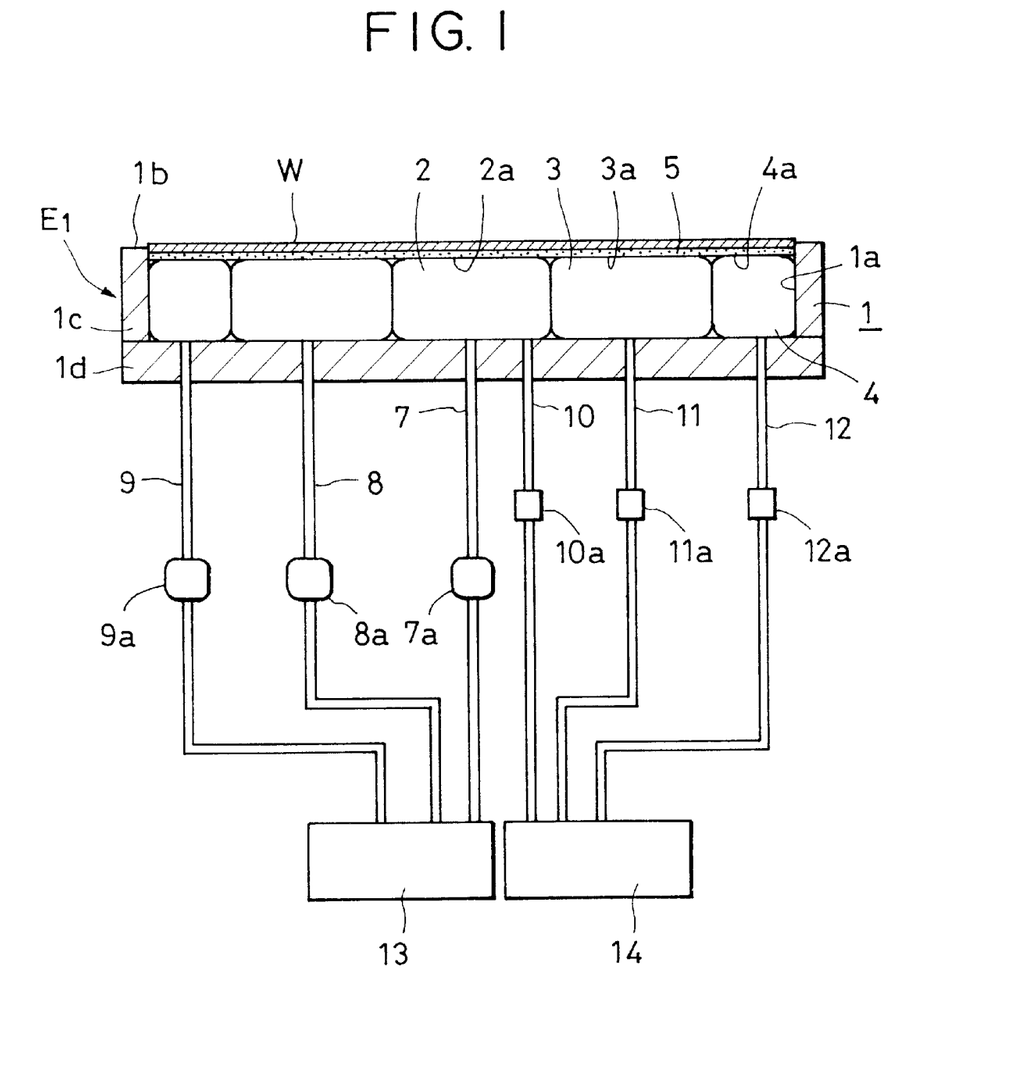
FIG. 1 is a view showing an embodiment of a substrate holding device in accordance with the present invention.

FIG. 1 is a view showing an embodiment of a substrate holding device in accordance with the present invention. The substrate holding device $E_1$ of this embodiment comprises a frame member 1 having a recess 1a whose substrate holding side is open; a first cylindrical fluid chamber 2 disposed at the center portion of the recess 1a; an annular second fluid chamber 3 and an annular third chamber 4 successively disposed concentrically and outwardly of the first fluid chamber 2. Deformable resilient films 2a, 3a and 4a form at least the substrate holding side walls of the fluid chambers 2, 3 and 4, respectively. A deformable backing member 5 is provided along the outer surfaces of the resilient films 2a, 3a and 4a so as to be exposed on the substrate holding side. The frame 1 includes a tabular member 1d and an annular member 1c. The tabular member 1d and the annular member 1c are either assembled together or formed integrally into one member.

Pressurization fluid supplying means 13 is connected to the fluid chambers 2, 3 and 4 through respective first, second and third supply paths 7, 8 and 9 provided with control valves 7a, 8a and 9a, respectively, in order to separately increase or decrease the inside pressures of the fluid chambers 2 to 4. When necessary, pressure-reducing means 14 is connected to the fluid chambers 2 to 4 through respective first, second and third discharge paths 10, 11 and 12 provided with control valves 10a, 11a and 12a, respectively.

A pressure regulating means, comprising a piston and a cylinder, which operate together to change the pressure in the first to third fluid chambers, can be used in place of the pressurization fluid supplying means 13 and the pressure-reducing means 14.

In the substrate holding device $E_1$ shown in FIG. 1, using the control valves 7a to 9a, provided in the respective supply paths 7 to 9, to separately control, for example, the flow rate of the pressurization fluid to be introduced into the fluid chambers 2 to 4 in order to separately increase the inside pressures in the respective fluid chambers 2 to 4, allows the amount of protrusion of each of the resilient films 2a to 4a towards the substrate holding side to be changed. On the other hand, using the control valves 10a to 12a, provided in their respective discharge paths 10 to 12, to separately control the discharge rate of the pressurization fluid from the fluid chambers 2 to 4 in order to separately decrease the inside pressures in the respective fluid chambers 2 to 4 allows the amount of protrusion of each of the resilient films 2a to 4a towards the side opposite to the substrate holding side to be changed.

In the substrate holding device $E_1$ of FIG. 1, the amount of protrusion of the resilient films 2a to 4a generated by the respective fluid chambers 2 to 4 can be controlled such that the back surface of a substrate W comes into close contact with the outer surface of the backing member 5, when the inside pressures in each of the fluid chambers 2 to 4 are separately adjusted to removably fit and hold the substrate W at the inner peripheral face at the open side of the recess 1a. Here, the top surface of the substrate W protrudes slightly above the top end surface 1b at the peripheral edge of the frame member 1.

When the backing member 5 is made of a material having a greater coefficient of friction with respect to the substrate surface than the resilient films, it can be brought into closer contact with the substrate W.

Figure 2:
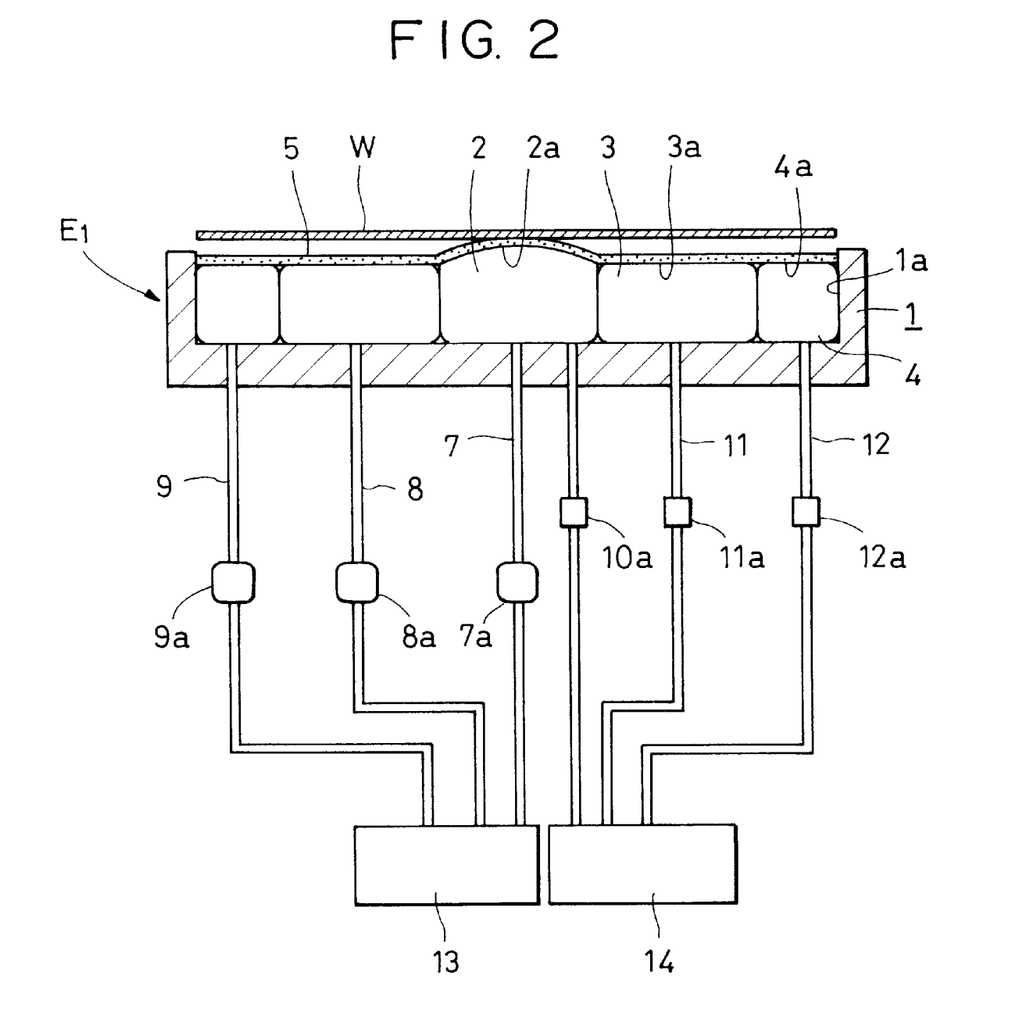
FIG. 2 is a view illustrating a substrate being removed from the substrate holding device of FIG. 1.

As shown in FIG. 2, in removing a substrate W being held or at an initial stage of mounting the substrate W, the substrate W can be pushed out and easily removed from the substrate holding device $E_1$ by increasing the inside pressure of the first fluid chamber 2. The inside pressure is increased by increasing, for example, the flow rate of the pressurization fluid to be introduced into the first fluid chamber 2 disposed at the center portion of the recess 1a, whereby the resilient film 2a, as well as the center portion of the backing member 5, bulge upward. In contrast, the substrate W can be attracted to and held by the substrate holding device $E_1$ by causing the resilient film 2a to protrude in the opposite direction by decreasing the inside pressure in the first fluid chamber 2. It is also possible to remove or attract the substrate W by causing the resilient film 3a to protrude in the form of a doughnut as a result of increasing the inside pressure in the second fluid chamber 3.

Figure 3:
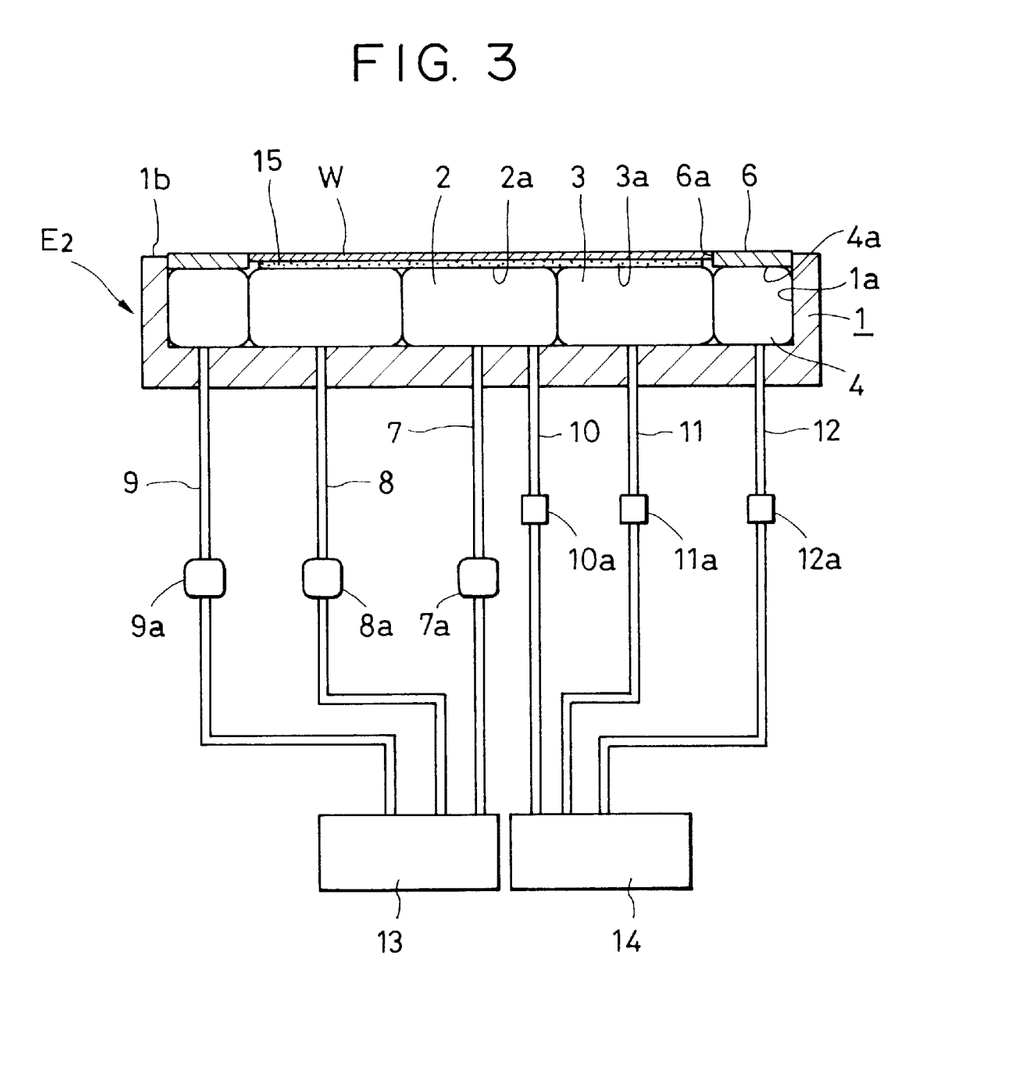
FIG. 3 is a view showing another embodiment of a substrate holding device in accordance with the present invention.

FIG. 3 is a view showing another embodiment of a substrate holding device of the present invention. The substrate holding device $E_2$ of this embodiment comprises a guide ring 6 provided at the outer surface of the resilient film 4a on the substrate holding side of the third fluid chamber 4; and a deformable backing member 15 provided at the outer surfaces of the resilient films 2a and 3a on the substrate holding sides of the respective first and second fluid chambers 2 and 3, exposed on the substrate holding side.

The components other than those described above are essentially the same as those of the substrate holding device $E_1$ shown in FIG. 1, so that they will not be discussed below.

In the substrate holding device $E_2$ shown in FIG. 3, the resilient film 4a of the third fluid chamber 4 can be caused to protrude towards the substrate holding side by an even greater amount as a result of separately controlling, for example, the flow rate of the pressurization fluid to be introduced into the first, second and third fluid chambers 2, 3 and 4. With the top surface of the guide ring 6 protruding slightly above the upper end surface 1b of the peripheral edge of the frame member 1, as well as the outer surface of the backing member 15 on the resilient films 2a and 3a of the first and second fluid chambers 2 and 3, respectively, removably fitting the substrate W at an inner diameter face 6a of the guide ring 6 allows the substrate W to be held by the substrate holding device $E_2$ such that the backing member 15 is in contact with the back surface of the substrate W. The amount of protrusion of the top surface of the guide ring 6 may, for example, be equal to about the thickness of the held substrate W being held.

Figure 4:
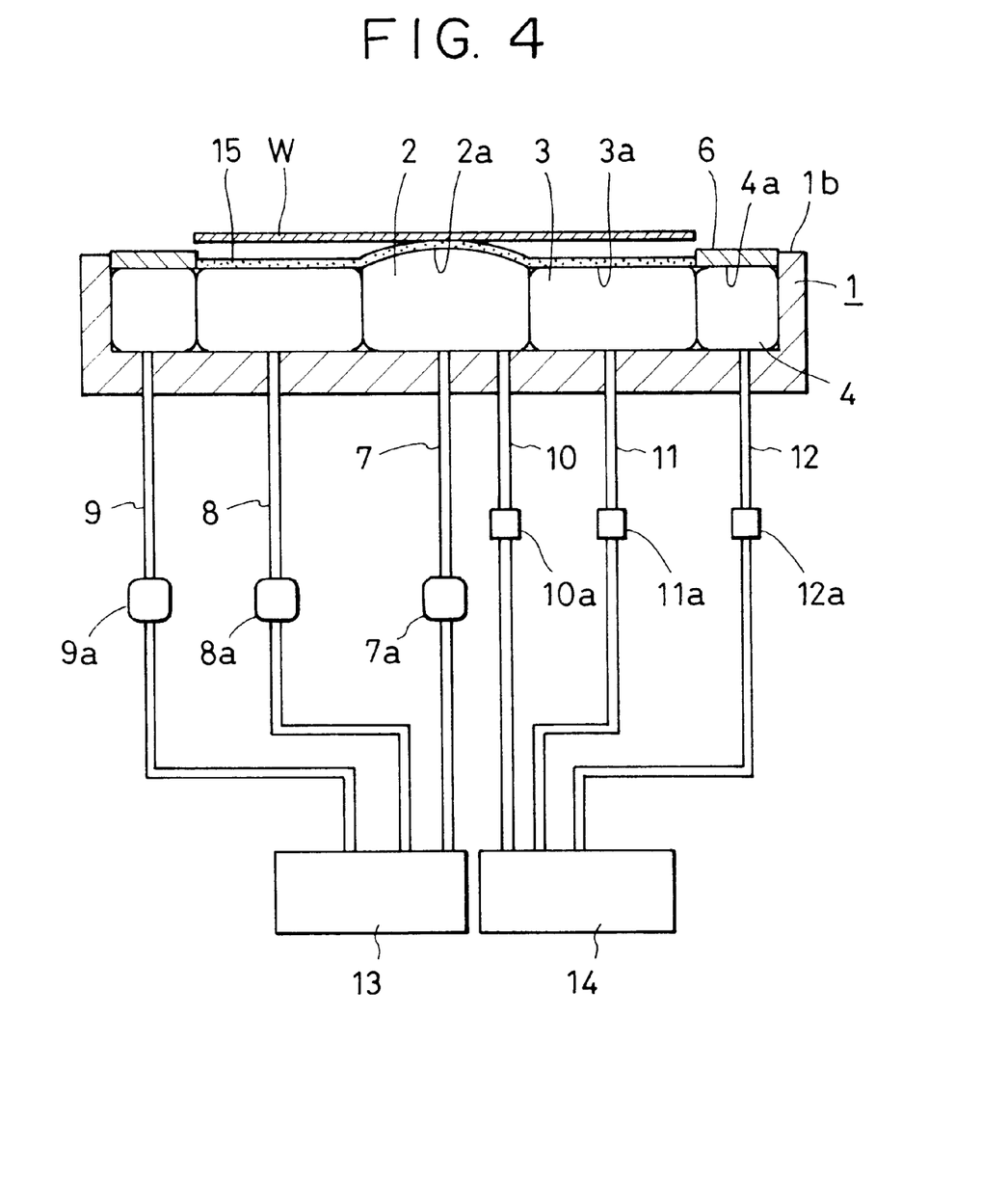
FIG. 4 is a view illustrating a substrate being removed from the substrate holding device of FIG. 3.

As shown in FIG. 4, in removing a substrate W being held or at an initial stage of mounting the substrate W, the substrate W can be easily removed from the substrate holding device $E_2$ by increasing the inside pressure in the first fluid chamber 2. The inside pressure is increased by increasing, for example, the flow rate of the pressurization fluid to be introduced into the first fluid chamber 2, whereby the resilient film 2a and the center portion of the backing member 15 bulge upward and push out the substrate W.

A description will now be given of embodiments of a polishing apparatus in accordance with the present invention.

Figure 5:
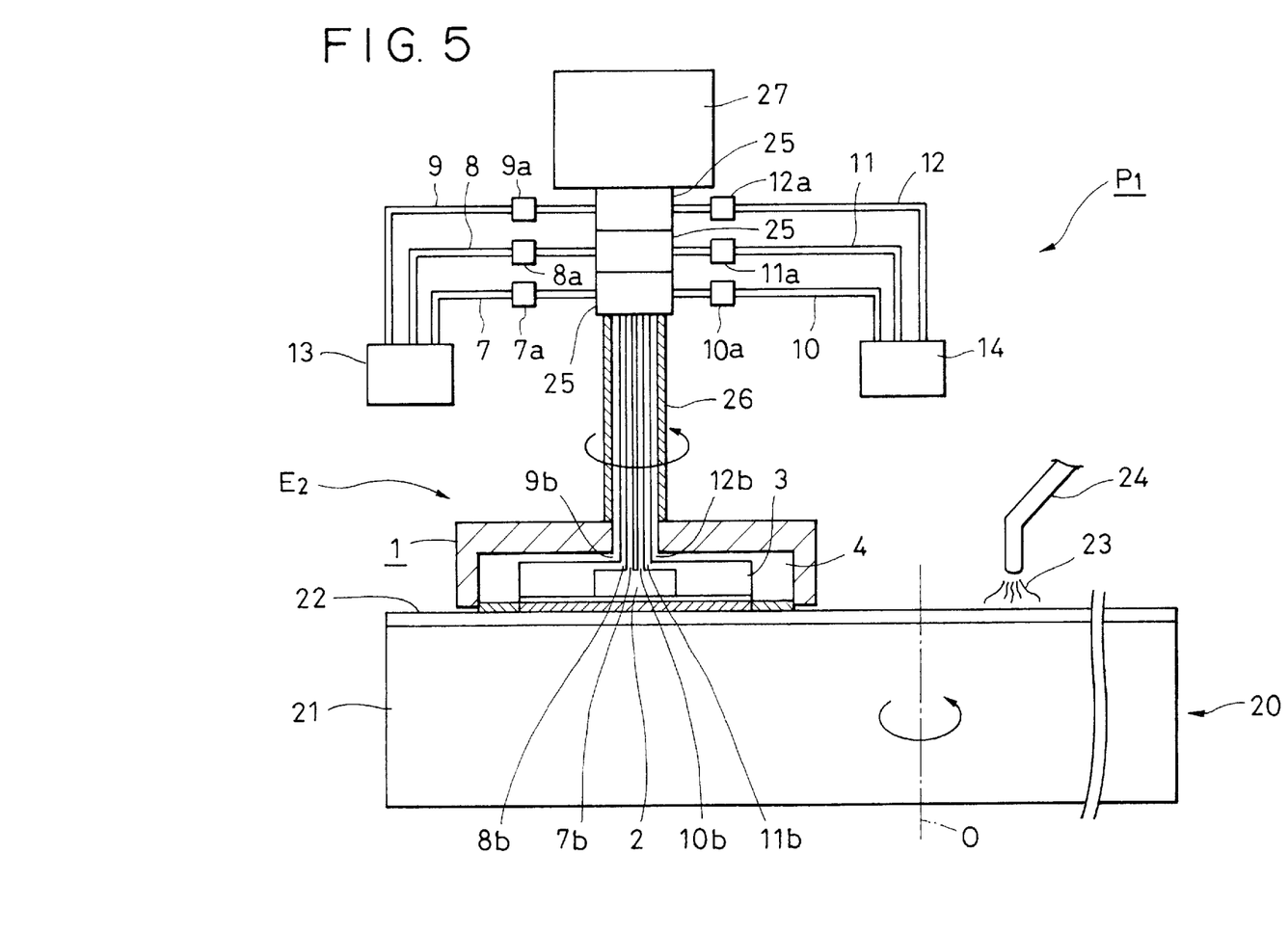
FIG. 5 is a view showing an embodiment of a polishing apparatus in accordance with the present invention.

FIG. 5 is a view showing an embodiment of a polishing apparatus of the present invention. The polishing apparatus $P_1$ employs the substrate holding device $E_2$ shown in FIG. 3, wherein the frame member 1 of the substrate holding device $E_2$ is affixed to the free end side of a hollow shaft member 26, which is moved rotationally and axially by a driving mechanism 27. Supply paths 7, 8 and 9 communicate with respective extension supply paths 7b, 8b and 9b, and discharge paths 10, 11 and 12 communicate with respective extension discharge paths 10b, 11b and 12b through a joint 25, which allows rotation of the shaft member 26. The extension paths 7b to 9b and 10b to 12b are provided in the shaft member 26.

A polishing station 20 includes a polishing tool 21 and a nozzle 24. The polishing tool 21 has a large aperture, which is at least twice that of the substrate W, and a polishing pad 22 at a polishing surface thereof opposing the substrate holding side of the substrate holding device $E_2$. The nozzle 24 constitutes a means for supplying an abrasive 23 onto the polishing pad 22. The polishing tool 21 is rotatably supported by a vibrating table (not shown), and is constructed such that a driving mechanism (not shown) causes it to rotate around a rotational axis 0 and to vibrate in a diametrical direction thereof.

Figure 6:
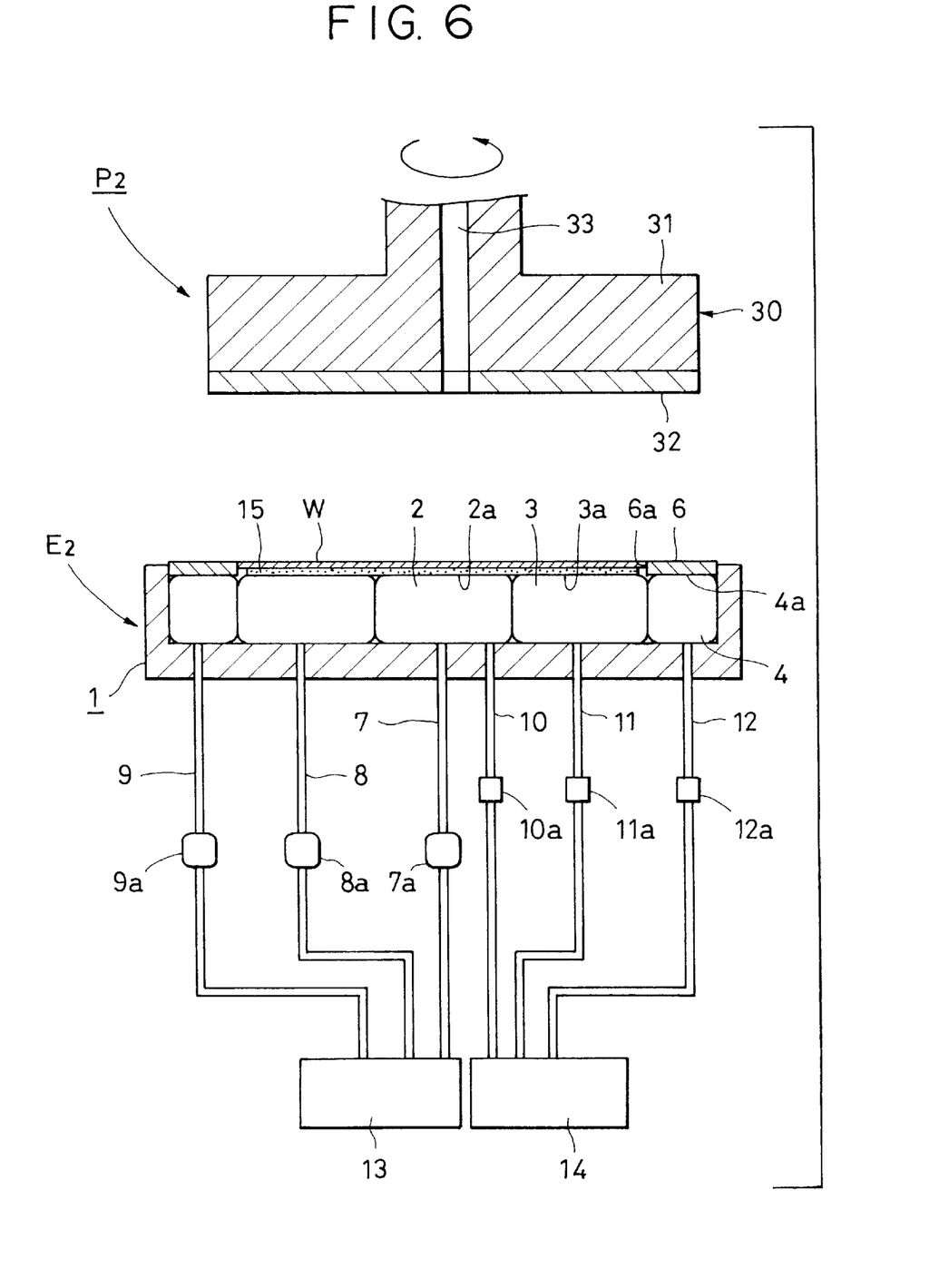
FIG. 6 is a view showing another embodiment of a polishing apparatus in accordance with the present invention.

FIG. 6 is a view showing another embodiment of a polishing apparatus of the present invention. In the polishing apparatus $P_2$, the substrate holding device $E_2$ shown in FIG. 3 is stationary, and a polishing station 30 with a polishing tool 31 having an aperture within the range of one to two times that of the substrate W is provided.

The polishing station 30 comprises a polishing pad 32 at the polishing surface thereof, which opposes the substrate holding side of the substrate holding device $E_2$, and a polishing tool 31 having an abrasive supplying path 33 in the center portion thereof. The polishing tool 31 is supported by a vibrating table (not shown), which causes the polishing tool 31 to move rotationally and axially. A driving mechanism (not shown) moves the polishing tool 31 to exert a predetermined processing pressure thereto. The driving mechanism causes the polishing tool 31, with the predetermined processing pressure exerted thereto, to rotate in the direction shown by the arrow or in a direction opposite to the direction shown by the arrow, or to vibrate in a diametrical direction.

A description will now be given of a polishing method in an embodiment in accordance with the present invention. In the description, reference is made to the polishing device $P_2$ shown in FIG. 6.

Step (1): As shown in FIG. 6, the top surface of the guide ring 6 protrudes slightly above the top surface of the backing member 15 as a result of separately controlling the flow rate of the pressurization fluid to be introduced into each of the fluid chambers 2 to 4. With the top surface of the guide ring 6 protruding slightly above the top surface of the backing member 15, the substrate W is fitted to an inner diameter portion 6a of the guide ring 6 in order to hold the substrate W, with its back surface in contact with the top surface of the backing member 15 and its outer surface (or surface to be polished) placed slightly above the top surface of the guide ring 6.

Step (2): After Step (1), the polishing pad 32 is brought into contact with the surface of the substrate W to be polished, while a predetermined processing pressure is applied to the polishing tool 31. Then, while an abrasive is being supplied through the abrasive supplying path 33, the polishing tool 31 is rotated with a predetermined rotational speed.

Step (3): After Step (2), the polishing tool 31 is rotated with a greater rotational speed, and vibrated in a diametrical direction to chemically and mechanically polish the wafer for a predetermined time.

Step (4): After Step (3), the polishing tool is moved away from the wafer W in order to measure the form of the polished surface of the wafer W.

Step (5): After Step (4), if the surface of the substrate W to be polished is not polished to the predetermined form, the above-described Steps (2) and (3) are repeated.

Step (6): The above-described Steps (4) and (5) are repeated until the surface of the substrate W to be polished is polished to the predetermined form. At the moment the surface of the substrate W is polished to the predetermined form, the polishing tool 31 is moved away from the substrate W to thereby end the polishing.

Step (7): After Step (6), as shown in FIG. 4, the substrate W is pushed out and removed from the substrate holding device by making the resilient film 2a and the center portion of the backing member 15 bulge above the top surface of the guide ring 6 as a result of increasing the flow rate of the pressurization fluid introduced into the first fluid chamber 2. Then, the wafer W on the first fluid chamber 2 is taken out of the substrate holding device.

In the present invention, the number of fluid chambers disposed concentrically within the recess of the frame member is not limited to three, so that two or four or more fluid chambers may be used.

The types of wafers that can be polished using the polishing method of the present invention include semiconductor wafers made of, for example, Si, Ge, GaAs, GaAlAs, or InP; and SOI wafers, in which a semiconductor layer is formed on an insulating surface, and insulating wafers. The substrate used may be one that is polished prior to, during, or after the formation of functional elements (such as a resistor, a capacitor, a diode, or a transistor) thereon.

Therefore, the outer surface of the substrate or the surface of the substrate to be polished may be a semiconductor surface, an insulating surface, an electrically conductive surface, or a surface that is a combination of at least two of the three aforementioned surfaces. The present invention is particularly suitable for use in polishing insulating films and/or electrically conductive films with multi-layered wirings, in which a film on a substrate needs to have substantially the same thickness throughout.

The polishing surface of the polishing tool of the present invention is preferably a surface of a cloth which is not woven, or a pad surface made of polyurethane foam or the like.

The abrasive used in the present invention is preferably a fluid containing fine particles therein. More specifically, the fine particles may be made of, for example, silica ($SiO_2$), alumina ($Al_2O_3$), manganese oxide ($MnO_2$), cerium oxide (CeO), or the like. The fluid may be, for example, a sodium hydroxide (NaOH) solution, a potassium hydroxide (KOH) solution, or an aqueous hydrogen peroxide ($H_2O_2$).

The diameter of the fine particles is preferably in the range of from about 8 nm to about 50 nm. The degree of agglomeration of the fine particles can be controlled by changing the pH of, for example, the fluid, such as potassium hydroxide. The polishing amount can be changed based on the degree of agglomeration.

In polishing a semiconductor surface, it is desirable to use a solution of sodium hydroxide in which silica is dispersed. In polishing an insulating film, it is desirable to use a solution of potassium hydroxide in which silica is dispersed. In polishing a metallic film such as a tungsten film, it is desirable to use aqueous hydrogen peroxide in which either alumina or manganese oxide is dispersed.

For example, when, in polishing a semiconductor surface, an aqueous solution of sodium hydroxide in which silica is dispersed is used as an abrasive, the silicon surface of the semiconductor reacts with the sodium hydroxide to produce a $Na_2SiO_3$ layer. This layer is removed by a mechanical polishing method employing silica and a polishing pad to allow a new silicon surface to be exposed to the outside, whereby the reaction continues. The aforementioned polishing method is, therefore, called chemical mechanical polishing.

The substrate holding device of the present invention may be employed not only in a polishing apparatus, but also in a joining (or bonding) apparatus used for joining (or bonding) wafers. More specifically, in the joining apparatus, the center portion of a surface of the substrate W bulges as a result of increasing the pressure in the first fluid chamber in order to join another substrate (not shown) with the substrate W. When the substrates are joined together, no void is formed at the boundary where the substrates are joined together. The joining method employing the apparatus of the present invention is disclosed in Japanese Unexamined Patent Publication No. 5-217819.

As can be understood from the foregoing description, according to the present invention, the pressure in each of the fluid chambers can be separately controlled, so that even when the substrate has a wavy shape or is warped, the substrate can be planarized by changing the amount of protrusion of the resilient films that form at least the substrate holding side wall faces of each of the fluid chambers. In addition, in removing the substrate being held, the substrate W can be pushed out for easy removal by increasing the amount of protrusion of the resilient film of the center fluid chamber. As discussed above, the amount of protrusion can be increased by increasing the pressure in the center fluid chamber.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A substrate holding device comprising:

a frame member for holding a substrate on an open side of said frame member, the open side being formed by a recess in said frame member;

a plurality of fluid chambers disposed concentrically in the recess of said frame member, a respective wall face on the substrate holding side of said frame member at least partially defining each fluid chamber, each wall face being formed by a deformable resilient film;

control means for separately controlling the pressure inside of each of said fluid chambers; and at least one guide ring disposed adjacent to a respective one of said plurality of fluid chambers on the substrate holding side of said frame member, said at least one guide ring being movable relative to said frame member by varying the pressure inside a respective fluid chamber.

2. A substrate holding device comprising:

a frame member for holding a substrate on an open side of said frame member, the open side being formed by a recess in said frame member;

a plurality of fluid chambers disposed concentrically in the recess of said frame member, a respective wall face on the substrate holding side of said frame member at least partially defining each fluid chamber, each wall face being formed by a deformable resilient film;

a deformable backing member disposed adjacent to a respective resilient film on the substrate holding side of said frame member, said backing member comprising a material having a greater coefficient of friction than that of the resilient film;

control means for separately controlling the pressure inside of each of said fluid chambers; and at least one guide ring disposed adjacent to a respective one of said plurality of fluid chambers on the substrate holding side of said frame member, said at least one guide ring being movable relative to said frame member by varying the pressure inside a respective fluid chamber.

3. A method for polishing a surface of a substrate, said method comprising the steps of:

providing a substrate holding device that comprises (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) control means for separately controlling the pressure inside of each of said fluid chambers, and (iv) at least one guide ring disposed adjacent to a respective one of said plurality of fluid chambers on the substrate holding side of said frame member, said at least one guide ring being movable relative to said frame member by varying the pressure inside a respective fluid chamber;

holding a substrate to be polished with the substrate holding device; and polishing the surface of the substrate by supplying an abrasive between the surface of the substrate, held by the substrate holding device, and a polishing surface of a polishing tool, which contacts the surface of the substrate as a result of a predetermined processing pressure being exerted by the polishing tool onto the surface of the substrate.

4. A method for polishing a surface of a substrate, said method comprising the steps of:

providing a substrate holding device that comprises (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) a deformable backing member disposed adjacent to a respective resilient film on the substrate holding side of said frame member, said backing member comprising a material having a greater coefficient of friction than that of the resilient film, (iv) control means for separately controlling the pressure inside of each of said fluid chambers, and (v) at least one guide ring disposed adjacent to a respective one of said plurality of fluid chambers on the substrate holding side of said frame member, said at least one guide ring being movable relative to said frame member by varying the pressure inside a respective fluid chamber;

holding a substrate to be polished with the substrate holding device; and polishing the surface of the substrate by supplying an abrasive between the surface of the substrate, held by the substrate holding device, and a polishing surface of a polishing tool, which contacts the surface of the substrate as a result of a predetermined processing pressure being exerted by the polishing tool onto the surface of the substrate.

5. A method for bonding substrates, said method comprising the steps of:

providing a substrate holding device that comprises (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) control means for separately controlling the pressure inside of each of said fluid chambers, and (iv) at least one guide ring disposed adjacent to a respective one of said plurality of fluid chambers on the substrate holding side of said frame member, said at least one guide ring being movable relative to said frame member by varying the pressure inside a respective fluid chamber;

holding one of the substrates using the substrate holding device; and joining the substrate being held by the substrate holding device with another substrate.

6. A method for bonding substrates, said method comprising the steps of:

providing a substrate holding device that comprises (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) a deformable backing member disposed adjacent to a respective resilient film on the substrate holding side of said frame member, said backing member comprising a material having a greater coefficient of friction than that of the resilient film, (iv) control means for separately controlling the pressure inside of each of said fluid chambers, and (v) at least one guide ring disposed adjacent to a respective one of said plurality of fluid chambers on the substrate holding side of said frame member, said at least one guide ring being movable relative to said frame member by varying the pressure inside a respective fluid chamber;

holding one of the substrates using the substrate holding device; and joining the substrate being held by the substrate holding device with another substrate.

7. A method according to claim 3, further comprising effecting at least one of increasing and decreasing the pressure inside each of the fluid chambers, selectively.

8. A method according to claim 3, further comprising increasing the inside pressure in one of the plurality of chambers to cause the resilient film of that fluid chamber to protrude outward, thereby removing a substrate being held.

9. A method according to claim 3, wherein the recess of the frame member has an inner peripheral face, which is shaped to allow a substrate to be removably fitted thereto.

10. A method according to claim 3, further comprising providing a guide ring having an inner peripheral face, which is shaped to allow the substrate to be removably fitted thereto, the guide ring being disposed above the outer surface of the resilient film of the concentrically outermost fluid chamber.

11. A method according to claim 3, wherein the frame member is an assembly of a plurality of elements.

12. A method according to claim 4, further comprising effecting at least one of increasing and decreasing the pressure inside each of the fluid chambers, selectively.

13. A method according to claim 4, further comprising increasing the inside pressure in one of the plurality of chambers to cause the resilient film of that fluid chamber to protrude outward, thereby removing a substrate being held.

14. A method according to claim 4, wherein the recess of the frame member has an inner peripheral face, which is shaped to allow a substrate to be removably fitted thereto.

15. A method according to claim 4, further comprising providing a guide ring having an inner peripheral face, which is shaped to allow the substrate to be removably fitted thereto, the guide ring being disposed above the outer surface of the resilient film of the concentrically outermost fluid chamber.

16. A method according to claim 4, wherein the frame member is an assembly of a plurality of elements.

17. A bonding method according to claim 5, further comprising increasing the inside pressure of the fluid chamber, which is located at the center of the recess, to cause the resilient film of that chamber to bulge and push out the substrates, in order to remove the joined substrates.

18. A bonding method according to claim 6, further comprising increasing the inside pressure of the fluid chamber, which is located at the center of the recess, to cause the resilient film of that chamber to bulge and push out the substrates, in order to remove the joined substrates.

19. A polishing apparatus for polishing a surface of a substrate, said apparatus comprising:

a substrate holding device for holding a substrate, said substrate holding device comprising (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) control means for separately controlling the pressure inside of each of said fluid chambers, and (iv) at least one guide ring disposed adjacent to a respective one of said plurality of fluid chambers on the substrate holding side of said frame member, said at least one guide ring being movable relative to said frame member by varying the pressure inside a respective fluid chamber; and a polishing device for polishing the surface of the substrate being held by said substrate holding device, said polishing device comprising a polishing tool having a polishing surface, wherein an abrasive is supplied between the surface of the substrate to be polished and the polishing surface of said polishing tool, and the substrate is polished by causing the polishing surface of said polishing tool to contact and exert a predetermined pressure on the surface of the substrate to be polished.

20. A polishing apparatus according to claim 19, wherein said control means increases the inside pressure of the fluid chamber, which is located at the center of the recess, to cause the resilient film of that chamber to bulge and push out the substrate, in order to remove a polished substrate.

21. A polishing apparatus according to claim 19, wherein the recess of said frame member has an inner peripheral face, which is shaped to allow a substrate to be removably fitted thereto.

22. A polishing apparatus for polishing a surface of a substrate, said apparatus comprising:

a substrate holding device for holding a substrate, said substrate holding device comprising (i) a frame member for holding a substrate on an open side of said frame member, the open side being formed by a recess in said frame member, (ii) a plurality of fluid chambers disposed concentrically in the recess of said frame member, a respective wall face on the substrate holding side of said frame member at least partially defining each fluid chamber, each wall face being formed by a deformable resilient film, (iii) a deformable backing member disposed adjacent to a respective resilient film on the substrate holding side of said frame member, said backing member comprising a material having a greater coefficient of friction than that of the resilient film, (iv) control means for separately controlling the pressure inside of each of said fluid chambers, and (v) at least one guide ring disposed adjacent to a respective one of said plurality of fluid chambers on the substrate holding side of said frame member, said at least one guide ring being movable relative to said frame member by varying the pressure inside a respective fluid chamber; and a polishing device for polishing the surface of the substrate being held by said substrate holding device, said polishing device comprising a polishing tool having a polishing surface, wherein an abrasive is supplied between the surface of the substrate to be polished and the polishing surface of said polishing tool, and the substrate is polished by causing the polishing surface of said polishing tool to contact and exert a predetermined pressure on the surface of the substrate to be polished.

23. A polishing apparatus according to claim 22, wherein said control means increases the inside pressure of the fluid chamber, which is located at the center of the recess, to cause the resilient film of that chamber to bulge and push out the substrate, in order to remove a polished substrate.

24. A polishing apparatus according to claim 22, wherein the recess of said frame member has an inner peripheral face, which is shaped to allow a substrate to be removably fitted thereto.

* * * * *